(12) United States Patent
Michalak

(10) Patent No.: US 9,330,736 B2
(45) Date of Patent: May 3, 2016

(54) PROCESSOR MEMORY OPTIMIZATION VIA PAGE ACCESS COUNTING

(71) Applicant: QUALCOMM Incorporated, San Diego, CA (US)

(72) Inventor: Gerald Paul Michalak, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 194 days.

(21) Appl. No.: 13/764,928

(22) Filed: Feb. 12, 2013

(65) Prior Publication Data

US 2014/0136773 A1    May 15, 2014

Related U.S. Application Data

(60) Provisional application No. 61/724,310, filed on Nov. 9, 2012.

(51) Int. Cl.
*G06F 12/02* (2006.01)
*G11C 7/10* (2006.01)
*G06F 3/06* (2006.01)
*G06F 12/10* (2016.01)

(52) U.S. Cl.
CPC ............ *G11C 7/1072* (2013.01); *G06F 3/0647* (2013.01); *G06F 3/0655* (2013.01); *G06F 12/023* (2013.01); *G06F 12/10* (2013.01); *G06F 2212/1016* (2013.01); *G06F 2212/1041* (2013.01); *Y02B 60/1225* (2013.01)

(58) Field of Classification Search
None
See application file for complete search history.

(56) References Cited

U.S. PATENT DOCUMENTS

| 6,961,840 B2 | 11/2005 | Fleming et al. |
| 8,078,827 B2 | 12/2011 | Uhlig et al. |
| 2006/0136668 A1* | 6/2006 | Rudelic ........................ 711/118 |
| 2007/0011421 A1 | 1/2007 | Keller et al. |
| 2007/0126756 A1 | 6/2007 | Glasco et al. |

(Continued)

FOREIGN PATENT DOCUMENTS

| EP | 0919927 | 6/1999 |
| WO | 2013090194 A1 | 6/2013 |

OTHER PUBLICATIONS

Kahng, Andrew et al., Mobile System Considerations for SDRAM Interface Trends, CSE and ECE Departments, University of California, San Diego, Qualcomm Inc., Jun. 5, 2011.

(Continued)

*Primary Examiner* — Prasith Thammavong
*Assistant Examiner* — Jason Blust
(74) *Attorney, Agent, or Firm* — Elaine H. Lo

(57) ABSTRACT

To utilize the most efficient memory available to a mobile processor, page access counters may be used to record utilization associated with multiple different memory types. In one embodiment, an operating system routine may analyze the page access counters to determine low utilization pages and high utilization pages to dynamically assign between the multiple different memory types, which may include a more efficient memory type having greater capacity, greater throughput, lower latency, or lower power consumption than a less efficient memory type. As such, in response to detecting a high utilization page in the less efficient memory or a low utilization page in the more efficient memory, contents associated therewith may be copied to the more efficient memory and the less efficient memory, respectively, and virtual-to-physical address mappings may be changed to reflect the reassignment.

55 Claims, 9 Drawing Sheets

(56) References Cited

U.S. PATENT DOCUMENTS

| | | | |
|---|---|---|---|
| 2008/0082731 A1* | 4/2008 | Karamcheti | G06F 13/1657 711/103 |
| 2008/0082766 A1* | 4/2008 | Okin | G06F 13/1684 711/154 |
| 2008/0177951 A1 | 7/2008 | Bartley et al. | |
| 2011/0010483 A1 | 1/2011 | Liljeberg | |
| 2012/0023300 A1* | 1/2012 | Tremaine et al. | 711/162 |

OTHER PUBLICATIONS

Kahng, Andrew et al., Mobile System Considerations for SDRAM Interface Trends, 2011.
International Search Report and Written Opinion—PCT/US2013/068951—ISA/EPO—Feb. 13, 2014.

* cited by examiner

PROCESSOR MEMORY OPTIMIZATION VIA PAGE ACCESS COUNTING

PRIORITY CLAIM UNDER 35 U.S.C. §119

Pursuant to 35 U.S.C. §119, the present application claims priority to U.S. Provisional Patent Application Ser. No. 61/724,310, entitled "PROCESSOR MEMORY OPTIMIZATION VIA PAGE ACCESS COUNTING," filed Nov. 9, 2012, the contents of which are hereby incorporated by reference in their entirety.

FIELD OF DISCLOSURE

The present application generally relates to processor memory optimization, and in particular, to efficiently assigning more efficient low power and low density memory to gain efficient memory utilization in a mobile processor.

BACKGROUND

Processors typically perform computational tasks in various applications, which may include embedded applications associated with portable or mobile electronic devices. The ever-expanding feature set and enhanced functionality associated with these electronic devices generally demands evermore computationally powerful processors. For example, most modern processors store recently executed instructions and recently used data in one or more cache memories that an instruction execution pipeline can readily access to capitalize on spatial and temporal locality properties associated with most programs or applications. In particular, a cache generally refers to a high-speed (usually on-chip) memory structure comprising a random access memory (RAM) and/or corresponding content addressable memory (CAM).

Beyond the last cache level, many processors have main memories with multiple different memory types that typically operate according to different throughputs, power efficiencies, capacities, and latencies. For example, the different memory types that may be used in main processor memories may include wide input/output (I/O) memory, serial memory, extreme data rate (XDR) or mobile XDR (M-XDR) memory, double data rate (DDR) memory, low power DDR (LPDDR) memory, stacked memory interface (SDI) architectures, and external bus interface (EBI) memory architectures, among others. Existing techniques attempting to balance or otherwise manage tradeoffs between the different throughputs, power efficiencies, capacities, latencies, and other characteristics associated with different memory types tend to assign fixed addresses to the different memory types. For example, one proposed solution to efficiently utilize processor memory is to configure how to allocate different memories within software at design-time. However, this proposed solution suffers from various drawbacks, including that statically defining how to assign the more efficient memory may result in the more efficient memory sitting idle in many use cases. Another proposed solution to this problem is to have a dynamic memory allocation routine handle the assignments. However, this proposed solution also has drawbacks, including that actual memory utilization may not be known to the dynamic memory allocation routine at the time that the memory is assigned.

Accordingly, processor optimizations that increase execution speed, reduce power consumption, and enhance memory utilization are desirable.

SUMMARY

The following presents a simplified summary of one or more embodiments of the processor memory optimization via page access counting disclosed herein in order to provide a basic understanding of such embodiments. As such, this summary should not be considered an extensive overview of all contemplated embodiments, nor is this summary intended to identify key or critical elements of all embodiments described herein or delineate the scope of any particular embodiment. Accordingly, the sole purpose of this summary is to present certain concepts relating to one or more embodiments relating to the processor memory optimizations disclosed herein in a simplified form as a prelude to the more detailed description presented below.

According to various embodiments, page access counting may be used to efficiently utilize low power and low density memory in a processor (e.g., a mobile processor). In particular, the processor may include a main memory having multiple different memory types, which may be dynamically assigned, changed, or otherwise utilized to gaul efficiency in various use cases. In one embodiment, memory utilization may be measured on a page basis via the page access counting and a kernel routine or operating system routine may then be used to map in efficient memory. For example, hardware-based page access counters may be used to record the memory utilization and the kernel or operating system routine may then change virtual address to physical address mappings to dynamically change memory assignments.

According to various embodiments, more memory pages may typically be in use in the multiple different memory types available in the main memory relative to the number of page access counters that are available, which may be substantially similar to the situation in an address translation cache (also referred to as a translation lookaside buffer or TLB). As such, in one embodiment, the page access counters may therefore be integrated into page tables associated with the different memories, wherein the page access counter integrated into a particular page table may be incremented in response to an event that accesses the page table. Furthermore, in response to an event that evicts an entry from the address translation cache or TLB, the page access counters associated with the evicted entry may be reset or updated accordingly. In one embodiment, to switch in a memory page of a more efficient one of the different memory types (e.g., a wide I/O memory relative to a DDR memory), the contents in the memory page may be copied from one physical memory device to the other physical memory device (e.g., from the DDR memory to the wide I/O memory). Furthermore, the efficiency gained from assigning more heavily used memory pages to the more efficient memory type may offset any overhead associated with the copy operation.

According to various embodiments, techniques to utilize the low power, low density, or otherwise more efficient memory that the processor has available in main memory via the page access counting may allow a more efficient memory to exist in parallel with the main memory. Moreover, the available memory may be dynamically assigned based on measured utilization (e.g., via the page access counters) to ensure that the more efficient memory will always be used for the most frequently accessed memory pages without requiring any change to user programs or applications because all software support may be localized to the kernel or operating system routine. In particular, the optimizations that dynamically change the mappings between virtual addresses and physical addresses may be transparent to user programs that employ the virtual addresses to access data stored in physical memory, in that kernel or operating system routine may change the physical address where the physical memory stores the data and update the mapping associated with the virtual address to reflect, the new physical address. As such, user programs may employ the same virtual addresses to access the data at the new physical addresses without any change.

According to one embodiment, a method to efficiently utilize processor memory may comprise monitoring page access counters that measure utilization associated with pages in a first memory and pages in a second memory, wherein the first memory has a higher efficiency than the second memory (e.g., based on respective power consumptions, densities, latencies, and/or bandwidths associated therewith), and the method may further comprise dynamically assigning the pages in the first memory and the pages in the second memory based on the monitored page access counters. For example, in one embodiment, dynamically assigning the pages in the first memory and the pages in the second memory may comprise copying contents associated with pages in the second memory that have high utilizations to the first memory, copying contents associated with pages in the first memory that have low utilizations to the second memory, and changing mappings between virtual addresses and physical addresses that correspond to the dynamically assigned pages based on the copying. In one embodiment, the page access counters may comprise hardware-based counters integrated into page tables that store mappings between virtual addresses and physical addresses associated with the pages in the first and second memories. Furthermore, in one embodiment, the method may further comprise detecting an event associated with one or more of a page in the first memory or a page in the second memory and updating the page access counter associated with the page that corresponds to the detected event based on a type associated with the detected event. For example, the page access counter associated with the page that corresponds to the detected event may be incremented if the type associated with the detected event comprises accessing the page, or alternatively the page access counter may be reset if the type associated with the detected event evicts an entry that corresponds to the page from a data structure that maps a virtual to physical address associated therewith.

According to another embodiment, an apparatus to efficiently utilize processor memory may comprise means for monitoring page access counters that measure utilization associated with pages in a first memory and pages in a second memory and means for dynamically assigning the pages in the first memory and the pages in the second memory based on the monitored page access counters. For example, in one embodiment, the means for dynamically assigning the pages may comprise means for copying contents associated with pages in the second memory that have high utilizations to the first memory, means for copying contents associated with pages in the first memory that have low utilizations to the second memory, and means for changing mappings between virtual addresses and physical addresses that correspond to the dynamically assigned pages based on the copying. In one embodiment, the page access counters may comprise hardware-based counters integrated into page tables that store mappings between virtual addresses and physical addresses associated with the pages in the first and second memories. Furthermore, in one embodiment, the means for dynamically assigning the pages in the first memory and the pages in the second memory comprises a kernel or operating system routine.

According to another embodiment, a computer-readable storage medium having computer-executable instructions recorded thereon may be used to efficiently utilize processor memory, wherein executing the computer-executable instructions on a processor may cause the processor to monitor page access counters that measure utilization associated with pages in a first memory and pages in a second memory and dynamically assign the pages in the first memory and the pages in the second memory based on the monitored page access counters. For example, in one embodiment, the computer-executable instructions may cause the processor to copy contents associated with pages in the second memory that have high utilizations to the first memory, copy contents associated with pages in the first memory that have low utilizations to the second memory, and change mappings between virtual addresses and physical addresses that correspond to the dynamically assigned pages based on the copying in order to dynamically assign the pages in the first and second memories. In one embodiment, the computer-executable instructions comprise a kernel or operating system routine and the page access counters may comprise hardware-based counters integrated into page tables that store mappings between virtual addresses and physical addresses associated with the pages in the first and second memories.

According to another embodiment, an apparatus that may efficiently utilize processor memory may comprise, among other things, a memory architecture having first memory and a second memory and a processor configured to execute a kernel or operating system routine that causes the processor to monitor page access counters that measure utilization associated with pages in the first memory and pages in the second memory and dynamically assign the pages in the first memory and the pages in the second memory based on the monitored page access counters. For example, in one embodiment, the kernel or operating system routine may cause the processor to copy contents from pages in the second memory that have high utilizations to the first memory and copy contents from pages in the first memory that have low utilizations to the second memory in order to dynamically assign the pages in the first and second memories, wherein mappings between virtual addresses and physical addresses that correspond to the dynamically assigned pages may then be appropriately changed.

Other objects and advantages associated with the embodiments relating to the processor memory optimizations described herein will be apparent to those skilled in the art based on the accompanying drawings and detailed description.

BRIEF DESCRIPTION OF THE DRAWINGS

The accompanying drawings are presented to aid in the description of the embodiments disclosed herein and are provided solely to illustrate exemplary features associated with the disclosed embodiments without defining any limitations thereof.

DETAILED DESCRIPTION

Aspects are disclosed in the following description and related drawings to show specific examples relating to various exemplary embodiments of processor memory optimization via page access counting. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is provided to describe particular embodiments only and is not intended to limit any embodiments disclosed herein. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1:
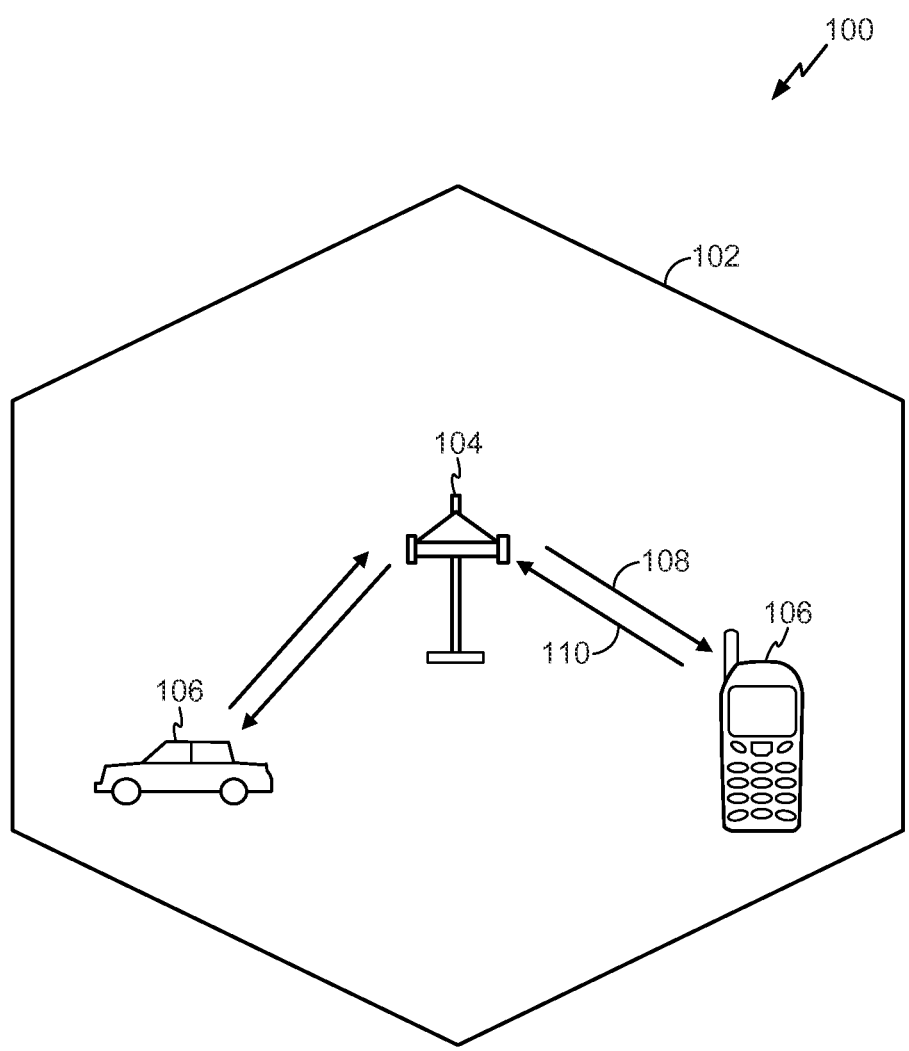
FIG. 1 illustrates an exemplary wireless communication system that includes a mobile device with a memory architecture that may implement the processor memory optimizations described herein, according to one exemplary embodiment.

According to one embodiment, FIG. 1 illustrates a wireless communication system 100 that includes one or more mobile devices 106 with memory architectures that may implement the processor memory optimizations described herein. In one embodiment, the wireless communication system 100 may operate pursuant to any suitable wireless standard. For example, the wireless communication system 100 may be a multiple-access network that can share available network resources to support multiple users, wherein exemplary multiple-access networks may include Code Division Multiple Access (CDMA) networks, Time Division Multiple Access (TDMA) networks, Frequency Division Multiple Access (FDMA) networks, and Orthogonal FDMA (OFDMA) networks. These multiple-access networks may implement various radio technologies, wherein the terms "radio technology," "radio access technology" (RAT), "access technology," and "air interface" may often be used interchangeably. A CDMA network may implement a radio technology such as cdma2000 (e.g., pursuant to one or more of the IS-2000, IS-856, and/or IS-95 standard). Wideband-CDMA (W-CDMA), or other suitable radio technologies. A CDMA2000 1× (or simply "1×") network refers to a wireless network that implements IS-2000 and/or IS-95. A CDMA2000 1× EV-DO (or simply "1× EV-DO") network refers to a wireless network that implements IS-856. A Universal Mobile Telecommunications System (UMTS) network is a wireless network that implements W-CDMA. A TDMA network may implement a radio technology such as Global System for Mobile Communications (GSM). These various radio technologies, standards, and cellular networks are known in the art. W-CDMA, GSM and UMTS are described in documents from an organization named "3rd Generation Partnership Project" (3GPP), while cdma2000 is described in documents from an organization named "3rd Generation Partnership Project 2" (3GPP2). 3GPP and 3GPP2 documents are publicly available.

In one embodiment, in addition to the one or more mobile devices 106, the wireless communication system 100 shown in FIG. 1 may include an access point (AP) 104 that communicates with the one or more mobile devices 106, wherein the AP 104 may also comprise, be implemented as, or known as a NodeB, a Radio Network Controller (RNC), an eNodeB, a Base Station Controller (BSC), a Base Transceiver Station (BTS), a Base Station (BS), a Transceiver Function (TF), a Radio Router, a Radio Transceiver, or other suitable terminology.

In general, the AP 104 may serve as a hub or base station for the wireless communication system 100 and the one or more mobile devices 106 may serve as users in the wireless communication system 100. For example, in one embodiment, a mobile device 106 may be a laptop computer, a personal digital assistant (PDA), a mobile phone, or any other suitable device that can run on battery power and/or support wireless communication. A mobile device 106 may also comprise, be implemented as, or known as a mobile station (STA), a terminal, an access terminal (AT), a user equipment (UE), a subscriber station, a subscriber unit, a remote station, a remote terminal, a user terminal, a user agent, a user device, or other suitable terminology. In various embodiments, the mobile devices 106 may also comprise cellular telephones, cordless telephones, Session Initiation Protocol (SIP) phones, wireless local loop (WLL) stations, PDAs, handheld devices having wireless connection capabilities, or other suitable processing devices connected to wireless modems. Accordingly, one or more embodiments described herein may be incorporated into a phone (e.g., a cellular phone or smartphone), a computer (e.g., a laptop), a portable communication device, a headset, a portable computing device (e.g., a personal data assistant), an entertainment device (e.g., a music device, a video device, a satellite radio, etc.), a gaming device or system, a global positioning system device, or any other suitable mobile device configured to run on battery power and/or communicate via a wireless medium.

In one embodiment, the wireless communication system 100 may comprise a wireless local area network (WLAN) in which the mobile devices 106 connect to the AP 104 via a Wi-Fi compliant wireless link (e.g., an IEEE 802.11 protocol) to obtain general Internet connectivity or connectivity to another wide area network (WAN). In one embodiment, a mobile device 106 may also be used as the AP 104 (e.g., pursuant to the Wi-Fi Direct standard). The mobile devices 106 and the AP 104 may generally be referred to as transmitting or receiving nodes in the wireless communication network 100. In one embodiment, various processes and mechanisms may be used to support transmissions in the wireless communication system 100 between the mobile devices 106 and the AP 104. For example, in one embodiment, the transmissions in the wireless communication system 100 may generally include signals sent from the AP 104 and received at the mobile devices 106 and signals sent from the mobile devices 106 and received at the AP 104 in accordance with OFDM/OFDMA techniques, in which case the wireless communication system 100 may be referred to as an OFDM/OFDMA system. Alternatively (or additionally), the signals may be sent from and received at the AP 104 and the mobile devices 106 in accordance with CDMA techniques, in which case the wireless communication system 100 may be referred to as a CDMA system.

In one embodiment, a communication link that carries transmissions from the AP 104 to one or more of the mobile devices 106 may be referred to as a downlink (DL) 108, wherein the downlink 108 may also be referred to as a forward link or forward channel, and a communication link that carries transmissions from one or more of the mobile devices 106 to the AP 104 may be referred to as an uplink (UL) 110, wherein the uplink 110 may also be referred to as a reverse link or a reverse channel. In one embodiment, as noted above, the AP 104 may generally act as a base station or hub to provide wireless communication coverage in a basic service area (BSA) 102. In one embodiment, the AP 104 and the mobile devices 106 that use the AP 104 for wireless communication in the BSA 102 may be referred to as a basic service set (BSS). However, those skilled in the art will appreciate that the wireless communication system 100 may not necessarily have a central AP 104, but rather may function as a peer-to-peer or ad-hoc network between the mobile devices 106. Accordingly, the functions of the AP 104 described herein may alternatively be implemented or otherwise performed by one or more of the mobile devices 106 (e.g., pursuant to the Wi-Fi direct standard).

Figure 2:
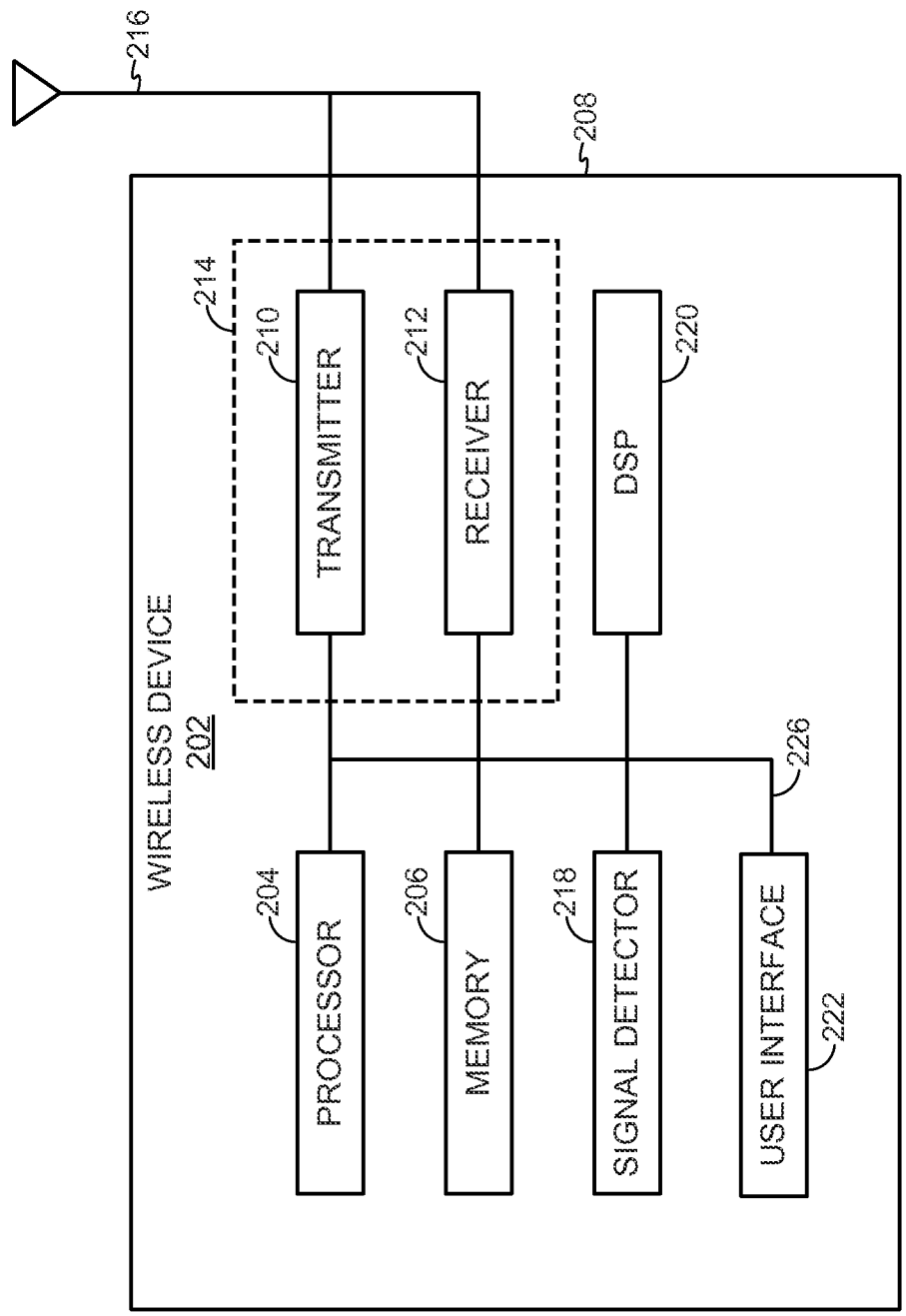
FIG. 2 illustrates an exemplary mobile device with a memory architecture that may implement the processor memory optimizations described herein, according to one exemplary embodiment.

According to one embodiment, FIG. 2 illustrates a mobile device 202 with a memory architecture that may implement the processor memory optimizations described herein within the wireless communication system 100 shown in FIG. 1. In one embodiment, the mobile device 202 may represent any suitable device that can be configured to implement the various features associated with the processor memory optimizations described herein. For example, in certain embodiments, the mobile device 202 shown in FIG. 2 may comprise the AP 104 shown in FIG. 1, one of the mobile devices 106 shown in FIG. 1, or one of the mobile devices 106 shown in FIG. 1 that implements or otherwise performs the functions of the AP 104 shown in FIG. 1.

In one embodiment, the mobile device 202 may include a processor 204 that controls operation of the mobile device 202. The processor 204 may also be referred to as a central processing unit (CPU). In addition, the mobile device 202 may include a memory 206, which may include RAM, read-only memory (ROM), DDR memory, wide I/O memory, or other suitable memory technologies. In one embodiment, the memory 206 may store instructions and data that the processor 204 may execute and/or utilize to control the operation of the mobile device 202. In one embodiment, the memory 206 may further include non-volatile random access memory (NVRAM). The processor 204 may generally perform logical and arithmetic operations based on the instructions stored in the memory 206 and/or execute the instructions stored in the memory 206 to implement the memory optimizations described herein.

In one embodiment, the mobile device 202 may further include a housing 208 and a transceiver 214 having a transmitter 210 and a receiver 212 to allow transmission and reception of data between the mobile device 202 and a remote entity (e.g., a base station or AP, another mobile device, etc.). In one embodiment, the data may be transmitted to and received from the remote entity via an antenna 216, which may be attached to the housing 208 and electrically coupled to the transceiver 214. Furthermore, those skilled in the art will appreciate that the mobile device 202 may suitably include multiple transmitters, multiple receivers, multiple transceivers, and/or multiple antennas.

In one embodiment, the mobile device 202 may further include a signal detector 218 that may be used to detect and quantify the levels of signals transmitted and received via the transceiver 214. The signal detector 218 may detect such signals as total energy, energy per subcarrier per symbol, power spectral density, and other suitable signals. The mobile device 202 may also include a digital signal processor (DSP) 220 for use in processing the signals transmitted and received via the transceiver 214. For example, in one embodiment, the DSP 220 may be configured to generate data units for transmission via the transmitter 210. In various embodiments, the data unit may comprise a physical layer protocol data unit (PPDU), which may also be referred to as a packet or message, as will be apparent.

In one embodiment, the mobile device 202 may further include a user interface 222, which may comprise a keypad, a microphone, a speaker, a display, and/or other suitable elements or components that can convey information to a user of the mobile device 202 and/or receive input from the user. Furthermore, in one embodiment, the various components of the mobile device 202 may be coupled together via a bus system 226. For example, the bus system 226 may include an interconnection fabric, a data bus, a power bus, a control signal bus, a status signal bus, or any other suitable component that can interconnect or otherwise couple the various components of the mobile device 202 to one another. However, those skilled in the art will appreciate that the components of the mobile device 202 may be coupled or accept or provide inputs to each other using other suitable mechanisms.

Furthermore, although FIG. 2 illustrates the mobile device 202 as having various separate components, those skilled in the art will recognize that one or more of the components may be suitably combined or commonly implemented. For example, the processor 204 may implement the functionality described above with respect thereto in addition to the functionality described above with respect to the signal detector 218 and/or the DSP 220. Further, those skilled in the art will recognize that any particular component illustrated in FIG. 2 may be implemented using multiple separate elements (e.g., the transmitter 210 may include multiple transmitters 210, the receiver 212 may include multiple receivers 212, etc.).

Figure 3:
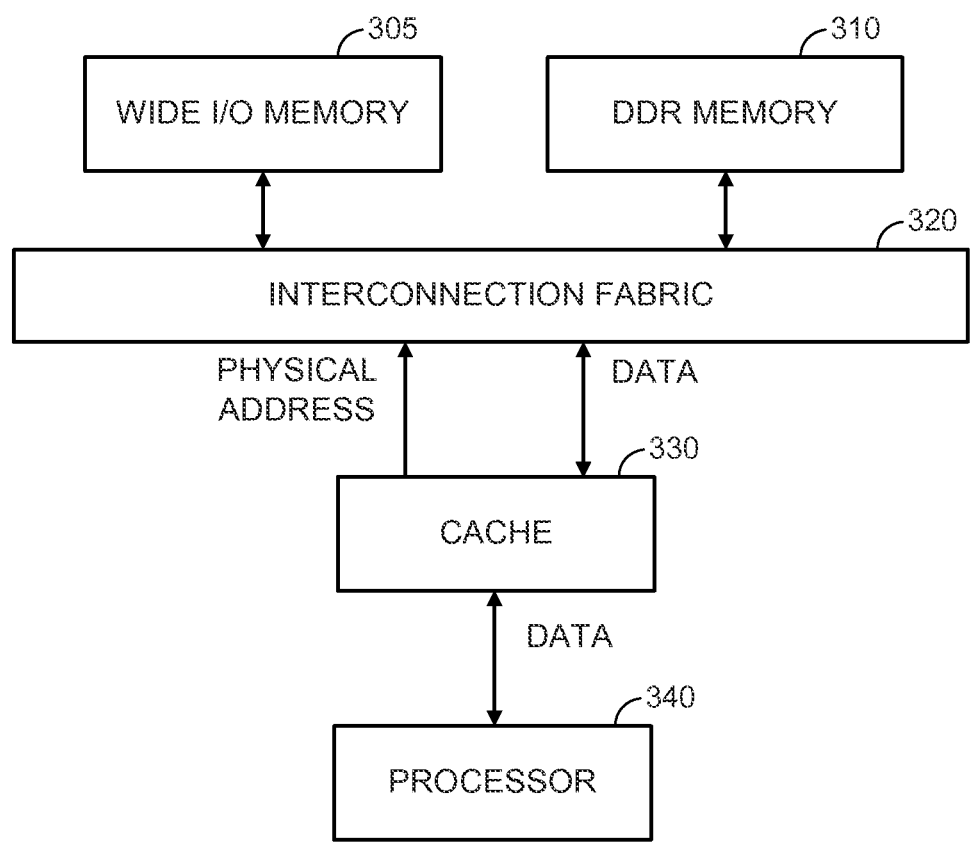
FIG. 3 illustrates an exemplary conventional memory architecture that may be employed in a mobile processor.

Referring now to FIG. 3, an exemplary conventional memory architecture that may be employed in a mobile processor is illustrated therein. In particular, the memory architecture shown in FIG. 3 may include a processor 340 coupled to a cache 330, wherein the processor 340 may store recently executed instructions and recently used data in the cache 330 and subsequently access the instructions and data stored in the cache 330 to obtain high-speed access to instructions and data that may be fed to an instruction execution pipeline. In one embodiment, the processor 340 and the cache 330 may connect to a main memory via a bus or other suitable interconnection fabric 320. In one embodiment, the interconnection fabric 320 may include or implement features associated with a translation lookaside buffer (TLB) to handle addressing and permissions associated with the main memory. As such, the processor 340 may provide data to be stored in the main memory to the interconnection fabric 320, which may store the data at a physical address in the main memory. Furthermore, to access data stored in the main memory, the processor 340 may provide the physical address associated with the data to the interconnection fabric 320, which may use the physical address to obtain the stored data, which may be stored in the cache 330. Those skilled in the art will appreciate that any known technique may be used to store and access data in the main memory within the conventional memory architecture shown in FIG. 3.

As shown in FIG. 3, the main memory may generally have two memory types, which may include wide I/O memory 305 and DDR memory 310. However, those skilled in the art will appreciate that the main memory may include different and/or additional memory types. In the illustrated example, the wide I/O memory 305 and the DDR memory 310 may generally have different throughputs, power efficiencies, latencies, and capacities and therefore a tradeoff may exist in relation to how to efficiently utilize the wide I/O memory 305 or the DDR memory 310. For example, the wide I/O memory 305 may generally enable chip-level three-dimensional stacking with Through Silicon Via (TSV) interconnects and memory chips directly stacked upon a System on a Chip (SoC), which may be particularly well-suited for applications requiring power efficiency and increased memory bandwidth (e.g., gaining, high-definition video, multitasking, etc.). Further, the DDR memory 310 may strictly control timing associated with electrical data and clock signals using phase-locked loops, self-calibration, and other techniques to realize high transfer rates. Accordingly, the wide I/O memory 305 may generally have a smaller capacity, lower power consumption, and higher bandwidth relative to the DDR memory 310, although the wide I/O memory 305 and the DDR memory 310 may generally have equal or substantially similar latencies.

Figure 4:
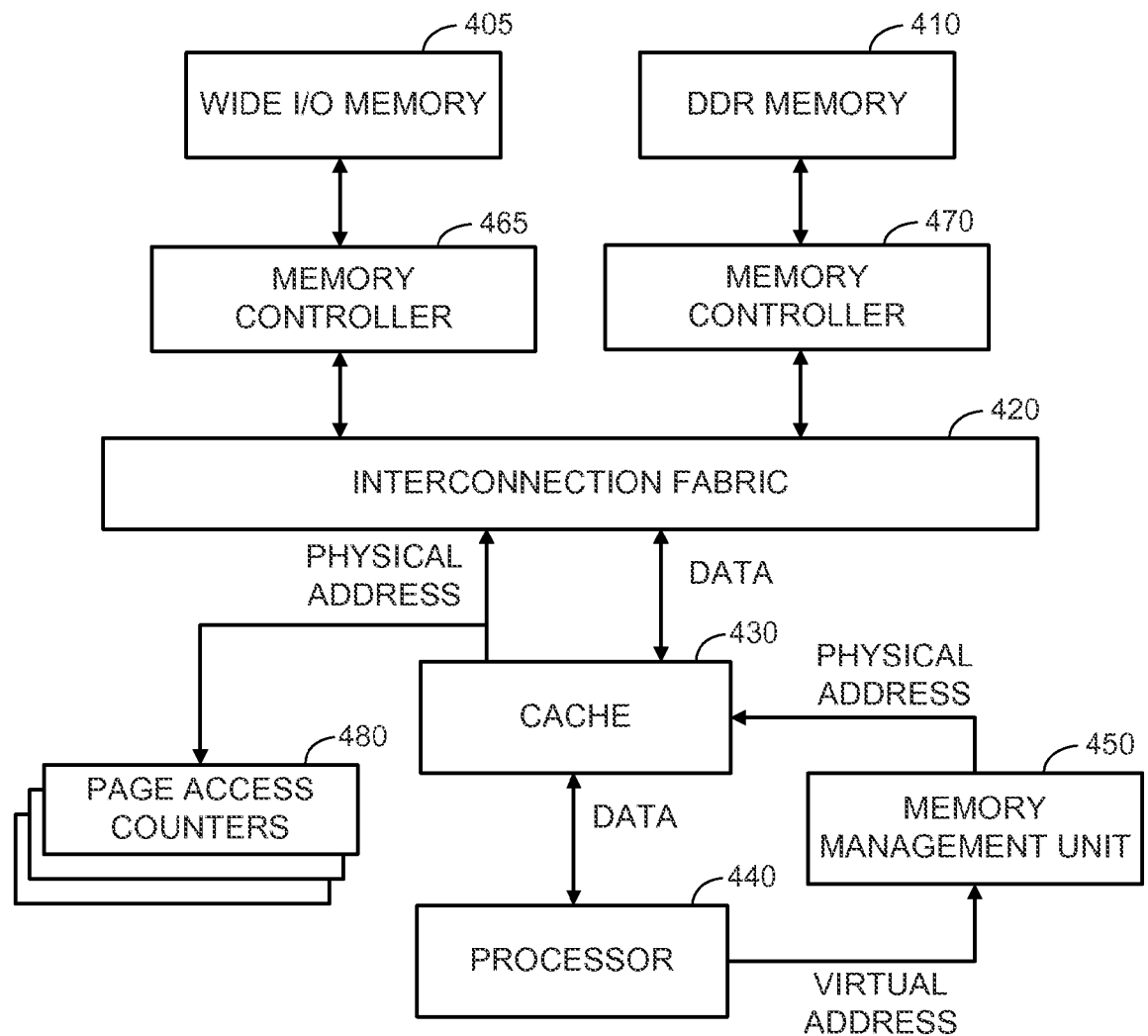
FIG. 4 illustrates an exemplary memory architecture that may be employed in a mobile processor to implement the processor memory optimizations described herein, according to one exemplary embodiment.

According to one embodiment, FIG. 4 illustrates a memory architecture that may be employed in a mobile processor to implement the processor memory optimizations described herein. In general, the memory architecture shown in FIG. 4 may include various components that are substantially similar to the memory architecture shown in FIG. 3 and described above, including a processor 440 configured to store recently executed instructions and recently used data in a cache 430 coupled thereto (e.g., to subsequently access the recently executed instructions and recently used data stored therein and thereby obtain high-speed access to instructions and data that may be fed to an instruction execution pipeline). As such, for brevity and ease of description, various details relating to certain components in the memory architecture shown in FIG. 4 may be omitted to the extent that the same or substantially similar details have been provided above in relation to FIG. 3.

In one embodiment, the memory architecture shown in FIG. 4 may generally monitor utilization associated with the wide I/O memory 405 and the DDR memory 410 and dynamically change assignments associated with one or more pages in the wide I/O memory 405 and/or the DDR memory 410 based on the monitored utilization. In general, the wide I/O memory 405 and the DDR memory 410 may be included or otherwise located in a main memory that is accessible to the processor 440 and located beyond a last level associated with the cache 430. In one embodiment, the memory architecture may record the monitored memory utilization with various page access counters 480, which may include hardware-based counters that measure how many times certain pages that have been assigned within the wide I/O memory 405 and/or the DDR memory 410 have been accessed. For example, in one embodiment, the hardware-based page access counters 480 may comprise special-purpose registers that can store counts relating to certain hardware-related activities, which in this case may comprise events that access or perform other I/O operations to utilize certain pages in the wide I/O memory 405 and/or the DDR memory 410. However, those skilled in the art will appreciate that other suitable mechanisms may be employed to implement the page access counters 480. Furthermore, in one embodiment, the memory architecture may include one or more memory controllers configured to monitor the memory utilization (e.g., memory controller 465 may monitor the utilization associated with the wide I/O memory 405 via the page access counters 480 associated therewith and memory controller 470 may monitor the utilization associated with the DDR memory 410 via the page access counters 480 associated therewith). As will be known to those skilled in the pertinent art, memory controller 465 and memory controller 470 may generally comprise digital circuits that control a data flow between interconnection fabric 420 and the wide I/O memory 405 and DDR memory 410 in main memory (e.g., containing logic that can read from and write to the wide I/O memory 405 and DDR memory 410, respectively). Furthermore, although FIG. 4 illustrates different memory controllers 465 and 470 associated with wide I/O memory 405 and DDR memory 410, those skilled in the art will appreciate that such illustration is for convenience only and that memory controllers 465 and 470 may be combined within one memory controller.

In one embodiment, in order to dynamically change the assignments associated with the pages in the wide I/O memory 405 and/or the DDR memory 410 based on the monitored utilization, the processor 440 may execute a kernel or operating system routine that can change virtual address to physical address mappings associated with the dynamically assigned pages. For example, in one embodiment, a memory management unit (MMU) 450 may maintain one or more page tables to store mappings between virtual addresses that are unique to accessing processes and physical addresses that are unique to hardware (e.g., the wide I/O memory 405 and the DDR memory 410), wherein the mappings between the virtual addresses and the physical addresses may be referred to as page table entries. When a process requests access to a particular virtual address, the processor 440 may provide the virtual address to the MMU 450, which then refers to the page table entries to map the virtual address to a physical address that corresponds to where the data associated with the virtual address is physically stored. Furthermore, as noted above, the interconnection fabric 420 may include or implement features associated with a TLB to handle addressing and permissions associated with the main memory, wherein the TLB may cache recent virtual-to-physical address mappings such that a subsequent request to access a particular virtual address associated with a mapping that is cached in the TLB does not require that the page tables be searched.

Figure 5A:
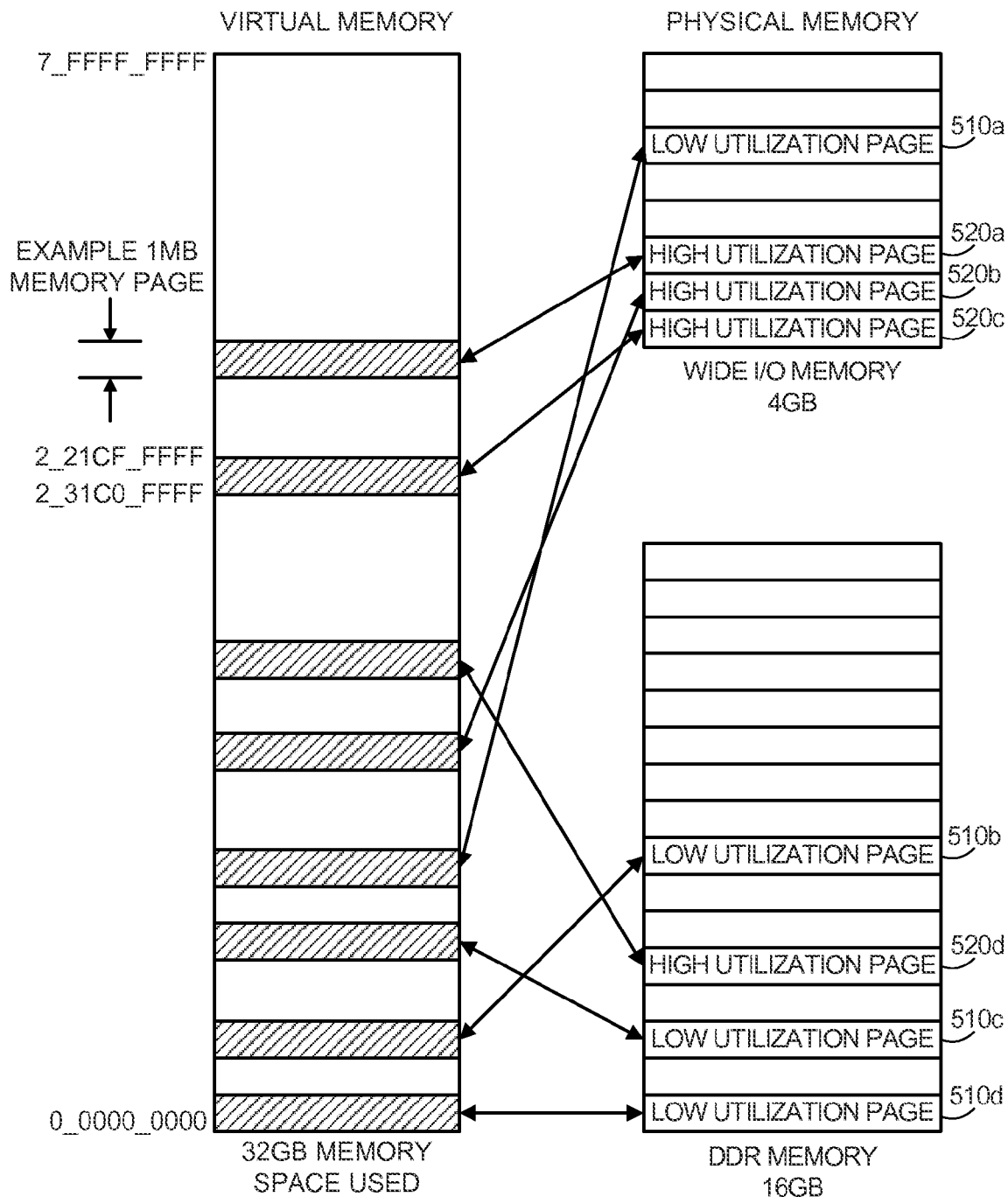
FIGS. 5A-B illustrate exemplary memory mappings that may be employed in a mobile processor to implement the processor memory optimizations described herein, wherein the memory mappings shown in FIG. 5A and FIG. 5B may respectively represent a memory assignment prior to and subsequent to optimization, according to one exemplary embodiment.
Figure 5B:
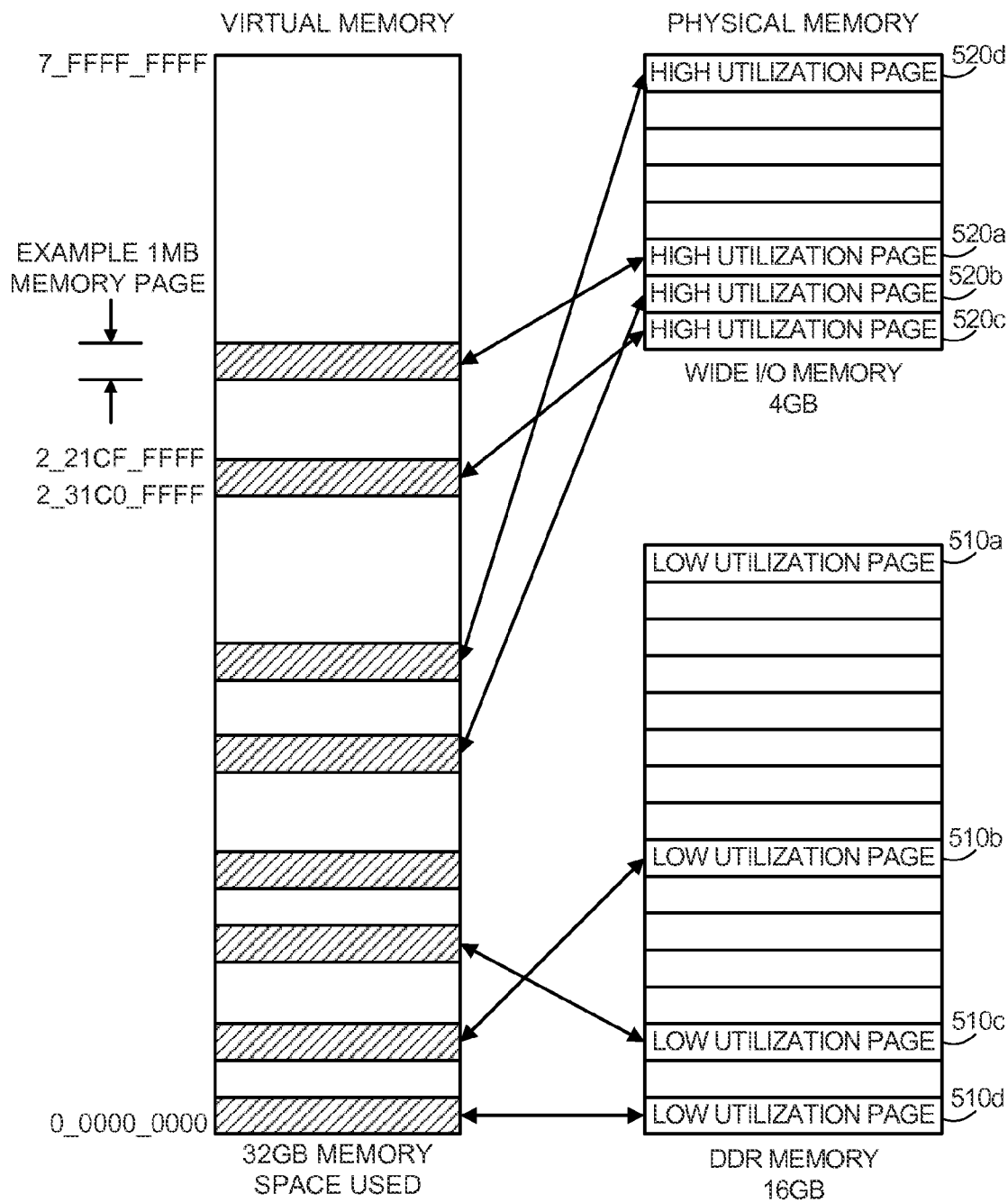

According to one embodiment, FIGS. 5A-B illustrate exemplary mappings between virtual memory and physical memory that the MMU 450 may use to dynamically change the assignments associated with the pages in the wide I/O memory 405 and/or the DDR memory 410. In particular, the virtual memory shown therein may generally comprise the entire address range available to the processor 440 and all processes that run thereon, wherein the MMU 450 may divide the virtual memory address space into various pages that have a particular size (e.g., one MB) and hexadecimal virtual addresses (e.g., 7_FFFF_FFFF, 2_21CF_FFFF, 2_31CF_FFFF, 0_0000_0000, etc.). Accordingly, in response to a request to allocate a page in the virtual memory, the MMU 450 may initially allocate the page in the physical memory and map the allocated page in the physical memory to a virtual address associated with a page in the virtual memory. Subsequently, in response to a request to access the virtual address, the MMU 450 may translate the virtual address to a physical address that corresponds to the physical memory page mapped thereto using an address translation cache, which may also be referred to as a translation lookaside buffer (TLB). Further details relating to how the virtual-to-physical address mappings are created, managed, or otherwise used will be apparent to those skilled in the art and will not be repeated herein for brevity.

In one embodiment, the number of memory pages in use may therefore exceed the number of page access counters available. For example, FIGS. 5A-B show an exemplary use case in which the wide I/O memory 405 comprises a 4 GB physical address space, DDR memory 410 comprises a 16 GB physical address space, and the virtual memory comprises a 32 GB address space in use. Assuming that each page in the physical address space associated with the wide I/O memory 405 and the DDR memory 410 has one page access counter available, more memory pages may be in use within virtual memory than the page access counters available in the physical address space. As such, in one embodiment, the page access counters 480 may be integrated into the page tables that store the mappings between the virtual memory addresses and the corresponding addresses in physical memory. For example, the various arrows shown in FIG. 5 may generally represent mappings between certain pages in virtual memory and physical memory, wherein the page access counters 480 associated with the pages in the physical memory may be integrated into the pages in the virtual memory that are mapped thereto. As shown in FIG. 5A, a memory assignment prior to optimization may map various addresses in the virtual memory to one or more pages in the wide I/O memory 405 that have high utilizations (e.g., pages 520*a*, 520*b*, 520*c*) and one or more pages in the wide I/O memory 405 that have low utilizations (e.g., page 510*a*). Furthermore, the memory assignment shown in FIG. 5A may further map various addresses in the virtual memory to one or more pages in the DDR memory 410 that have high utilizations (e.g., page 520*d*) and one or more pages in the DDR memory 410 that have low utilizations (e.g., pages 510*b*, 510*c*, 510*d*).

In one embodiment, each time that the MMU 450 receives a request to access a particular virtual address from the processor 440, the MMU 450 may translate the virtual address to the corresponding physical address and may further increment the page access counter 480 integrated into the page table entry that includes the translated virtual address in order to record the utilization associated with the page in physical memory that corresponds to the physical address translated from the virtual address. Furthermore, in one embodiment, the page access counters 480 that are integrated into the page tables may be appropriately updated in response to events that evict page table entries from the address translation cache or TLB. For example, as generally known to those skilled in the art, one or more existing entries in the address translation cache or TLB may be evicted to make room in the address translation cache to store one or more new entries on a cache miss, wherein a cache miss may occur if the page tables lack an entry that maps a requested virtual address to a corresponding physical address. As such, policies to evict entries from the address translation cache or TLB may include replacing the least-frequently-used (LFU) or least frequently accessed entry with a new entry on a cache miss and resetting the page access counter associated therewith to ensure that the page access counters 480 accurately measure utilizations associated with more heavily used pages. Alternatively (or additionally), the policies to evict the entries from the address translation cache or TLB may evict the least-recently-used (LRU) or least recently accessed entry to measure utilizations associated with more recently used pages (e.g., if multiple entries have the same or substantially similar utilizations, the entry that was used more recently may be preserved and the entry that was used less recently may be evicted to make room for the new entry).

In one embodiment, based on the utilizations measured with the page access counters 480, the kernel or operating system routine may change virtual address to physical address mappings used in the MMU 450 to dynamically assign (or reassign) pages to the most efficient memory available in the main memory associated with the processor 440. In one embodiment, relative efficiencies associated with different memory types that may be available in the main memory may be defined based on capacities, throughputs, latencies, and/or power efficiencies associated therewith. In particular, with respect to a given memory, capacity may generally refer to total storage available therein (typically expressed in GB), throughput may refer to the rate to transfer data over the memory interface associated therewith (typically expressed in GB/s or gigabytes per second), latency may refer to a portion of the cache miss penalty that represents a time for the MMU 450 to access the memory during a load instruction from the processor 440, and power efficiency may refer to the power that the memory consumes during idle, active, or other I/O states. Accordingly, in one embodiment, the kernel or operating system routine may be configured with predefined rules to specify relative efficiencies associated with certain existing memory types and therefore define the "more efficient" and "less efficient" memory types based thereon. For example, in one embodiment, wide I/O memory may generally have higher bandwidth (i.e., higher throughput and lower latency) and higher power efficiency (i.e., less power consumption when operating in the same state) relative to DDR memory, whereby the kernel or operating system routine may define wide I/O memory to have greater efficiency than DDR memory. Alternatively (or additionally), the kernel or operating system routine may run one or more appropriate benchmarking processes to measure the relative capacities, throughputs, latencies, and power efficiencies associated with the different memory types available in main memory and define the memory types having greater or lesser efficiency based thereon. In this manner, the processor memory optimizations described herein may be applied to existing and/or future-developed memory technologies and thereby leverage improvements in memory efficiencies to optimally assign (or reassign) pages among different memory types.

In one embodiment, in response to suitably defining or otherwise determining the relative efficiencies associated with the different memory types available in the main memory, the kernel or operating system routine may dynamically reassign certain pages from the less efficient memory (e.g., DDR memory 410 in FIG. 4) to the more efficient memory (e.g., wide I/O memory 405 in FIG. 4) based on the utilization recorded with the page access counters 480. In particular, to dynamically assign or otherwise switch a particular page from the less efficient memory to the more efficient memory (e.g., to switch high utilization page 520*d* from DDR memory 410 to wide I/O memory 405), the kernel or operating system routine may issue appropriate instructions to cause the memory controllers 465 and 470 to copy the contents associated with the page in DDR memory 410 to wide I/O memory 405. For example, in one embodiment, the pages that are switched from the less efficient memory to the more efficient memory may comprise pages that are most heavily used. In another embodiment, pages that are assigned to the more efficient memory and have low utilizations may be switched to the less efficient memory (e.g., low utilization page 510*a* may be copied or otherwise switched from wide I/O memory 405 to DDR memory 410). For example, in one embodiment, an optimization that copies or otherwise switches high utilization page 520*d* from DDR memory 410 to wide I/O memory 405 and that further copies or otherwise switches low utilization page 510*a* from wide I/O memory 405 to DDR memory 410 may result in the memory mapping shown in FIG. 5B, wherein the virtual to physical address mappings associated with high utilization page 520*d* and low utilization page 510*a* have been appropriately updated to reflect the change in memory assignment. In general, those skilled in the art will appreciate that various criteria may be used to determine or otherwise identify the pages that have high and low utilizations. For example, at the time that one or more pages are dynamically reassigned from the less efficient memory to the more efficient memory (or vice versa), the utilizations associated with the pages in the different memory types may be determined or otherwise identified relative to one another and the pages with the highest utilizations may be assigned to the more efficient memory until the more efficient memory fills up, wherein the pages may again be dynamically reassigned if any pages in the less efficient memory subsequently reach utilization levels that exceed one or more pages assigned to the more efficient memory. Alternatively (or additionally), a threshold value may be defined to require a certain minimum utilization level that pages may be required to reach before the pages are identified as being highly utilized (e.g., to avoid excessive reassignments between the different memory types).

Those skilled in the art will appreciate that various other techniques may be suitably employed to determine whether certain pages should be assigned to the more efficient or less efficient memory based on the utilization recorded with the page access counters 480. Furthermore, those skilled in the art will appreciate that the kernel or operating system routine that handles dynamically reassigning pages from one memory to another may be configured to dynamically reassign the pages based on one or more policies or other suitable criteria, wherein the policies or other criteria may cause the kernel or operating system routine to dynamically reassign the pages at periodic intervals, according to a predetermined schedule, and/or in response to certain triggering events (e.g., subsequent to each I/O operation, following a predetermined number of I/O operations, in response to determining that a threshold number of pages have been allocated in one or more of the more efficient or less efficient memory, in response to determining that one or more of the more efficient or less efficient memory has a threshold number of unallocated pages available, etc.).

Figure 6:
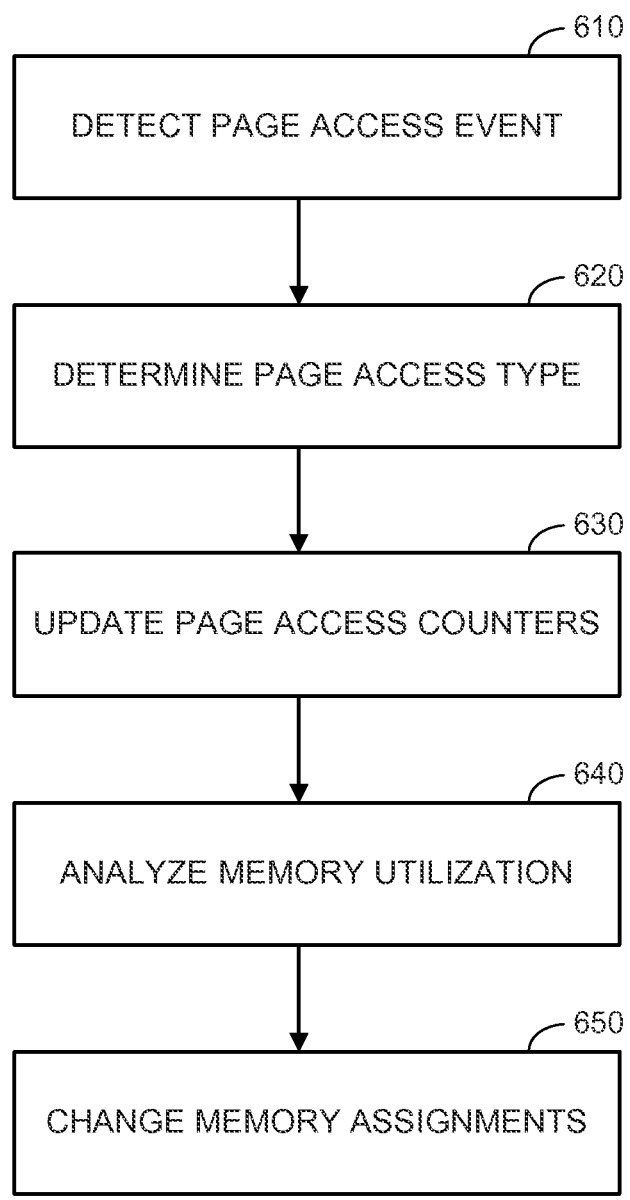
FIG. 6 illustrates an exemplary method to optimize memory utilization in a mobile processor, according to one exemplary embodiment.

In one embodiment, the method shown in FIG. 6 may comprise monitoring memory utilization in a main memory that includes multiple different memories with different efficiencies and dynamically changing assignments associated with pages in the different memories based on the monitored memory utilization. For example, in one embodiment, the memory utilization may be recorded with various page access counters that measure how many times certain pages within the different memories have been accessed. In one embodiment, at block 610, a page access event may be detected, wherein the page access event may comprise a process requesting access to a particular virtual address that has been mapped to a physical address within the main memory. In one embodiment, a type associated with the page access event may then be determined at block 620. For example, in one embodiment, the type determined in block 620 may include accessing a page in the physical memory that includes the physical address mapped to the virtual address associated with the request received in block 610. Furthermore, in one embodiment, the type determined in block 620 may further include evicting a page table entry that maps another page in the virtual memory to another page in the physical memory (e.g., to make room in an address translation cache or TLB to store the mapping between the virtual and physical memory pages that store the data associated with the request received in block 610 if the address translation cache or TLB did not already include the mapping).

In one embodiment, the page access counters that record the memory utilization may then be updated at block 630. For example, in one embodiment, block 630 may include incrementing the page access counter associated with the physical memory page that includes the physical address mapped to the requested virtual address to record the utilization associated with the access physical memory page. Additionally, in one embodiment, block 630 may further include resetting the page access counters that correspond to any physical memory pages that are associated with page table entries that have been evicted from the address translation cache or TLB. For example, as noted above, entries in the address translation cache or TLB may be evicted to make room to store new entries on a cache miss, which may occur if the page tables lack an entry that maps a requested virtual address to a physical address that corresponds thereto. As such, block 630 may include resetting the page access counters associated with entries that are evicted from the address translation cache or TLB to ensure that the page access counters measure utilizations associated with more heavily (or recently) used pages.

In one embodiment, the memory utilization recorded with the page access counters may then be analyzed at block 640. For example, in one embodiment, block 640 may be performed to analyze the memory utilization at periodic intervals, according to a predetermined schedule, in response to certain triggering events, and/or based on one or more policies or other suitable criteria. In one embodiment, based on the analyzed memory utilization, memory assignments may then be changed at block 650, which may comprise changing virtual to physical address mappings to dynamically assign (or reassign) pages to the most efficient of the different memories available in the main memory. For example, in one embodiment, block 650 may include dynamically reassigning certain heavily used pages from a less efficient memory to a more efficient memory and dynamically reassigning pages in the more efficient memory that have low utilizations to the less efficient memory, which may be determined based on the page access counters. In one embodiment, to dynamically change the memory assignments, block 650 may comprise copying the contents associated with a page in a first physical memory device to a second physical memory device and dynamically updating the corresponding virtual address mapping (i.e., the page in the first physical memory device may initially be mapped to a particular virtual address, whereby block 650 may change the mapping associated with that virtual address to the page in the second physical memory device).

Figure 7:
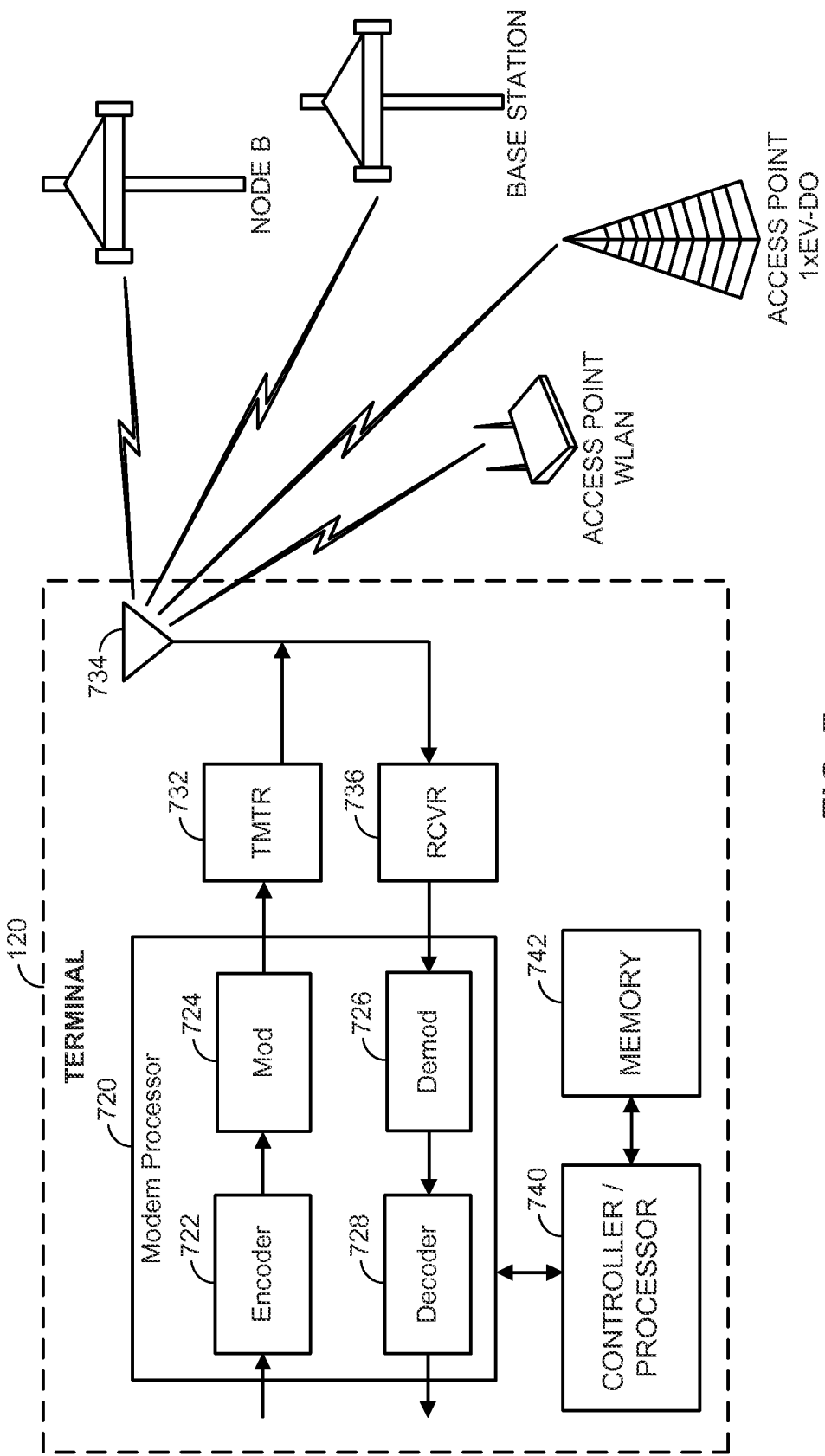
FIG. 7 illustrates an exemplary block diagram corresponding to a wireless communication device with a memory architecture that may implement the processor memory optimizations described herein, according to one exemplary embodiment.

According to one embodiment, FIG. 7 illustrates an exemplary block diagram that may correspond to a wireless communication device 120 with a memory architecture that may implement the processor memory optimizations described herein. On a transmit path, an encoder 722 may receive data and signaling to be sent by the wireless communication device 120 to a base station, a Node B, or an access point. The encoder 722 may process (e.g., format, encode, and interleave) the data and signaling in accordance with a suitable coding scheme. A modulator (Mod) 724 may further process (e.g., modulate and scramble) the coded data and signaling and generate output chips. In general, the processing by the encoder 722 and the modulator 724 may be determined by the radio technology (e.g., IEEE 802.11, 1×, 1× EV-DO, UMTS, or GSM) for a wireless network to which data is sent. In one embodiment, a transmitter (TMTR) 732 may condition (e.g., convert to analog, filter, amplify, and frequency upconvert) the output chips and generate a radio frequency (RF) signal, which may be transmitted to the base station, Node B, or access point over the wireless network via an antenna 734.

In one embodiment, on a receive path, the antenna 734 may receive RF signals transmitted by base stations, Node Bs, and/or access points. A receiver (RCVR) 736 may condition (e.g., filter, amplify, frequency downconvert, and digitize) the received RF signal from antenna 734 and provide samples. A demodulator (Demod) 726 may process (e.g., descramble and demodulate) the samples and provide symbol estimates. A decoder 728 may process (e.g., deinterleave and decode) the symbol estimates and provide decoded data and signaling. In general, the processing by the demodulator 726 and the decoder 728 may be complementary to the processing performed by the modulator and the encoder at the base stations, Node Bs, and/or access points. Furthermore, in one embodiment, the encoder 722, the modulator 724, the demodulator 726, and the decoder 728 may be implemented in a modem processor 720. Although FIG. 7 shows one instance of each processing unit for simplicity, in general, there may be one or multiple modem processors, transmitters, receivers, controllers, and memories for different radio technologies supported by wireless communication device 120.

In one embodiment, a controller/processor 740 may direct the operation of various processing units at wireless communication device 120. For example, in one embodiment, the controller/processor 740 and/or other processing units within wireless communication device 120 may implement various features to optimize processor memory via page access counting, as described above with reference to FIGS. 4-6. Controller/processor 740 may also implement or direct any other suitable processes or features described herein. In one embodiment, a memory 742 may store program codes and data for wireless communication device 120. Memory 742 may also store page counters (e.g., page access counters 480 in FIG. 4), virtual-to-physical memory address mappings (e.g., as shown in FIG. 5), or any other suitable data or information that may support the processor memory optimizations described herein, applications associated with the wireless communication device 120, and/or radio technologies used on the wireless communication device 120.

Figure 8:
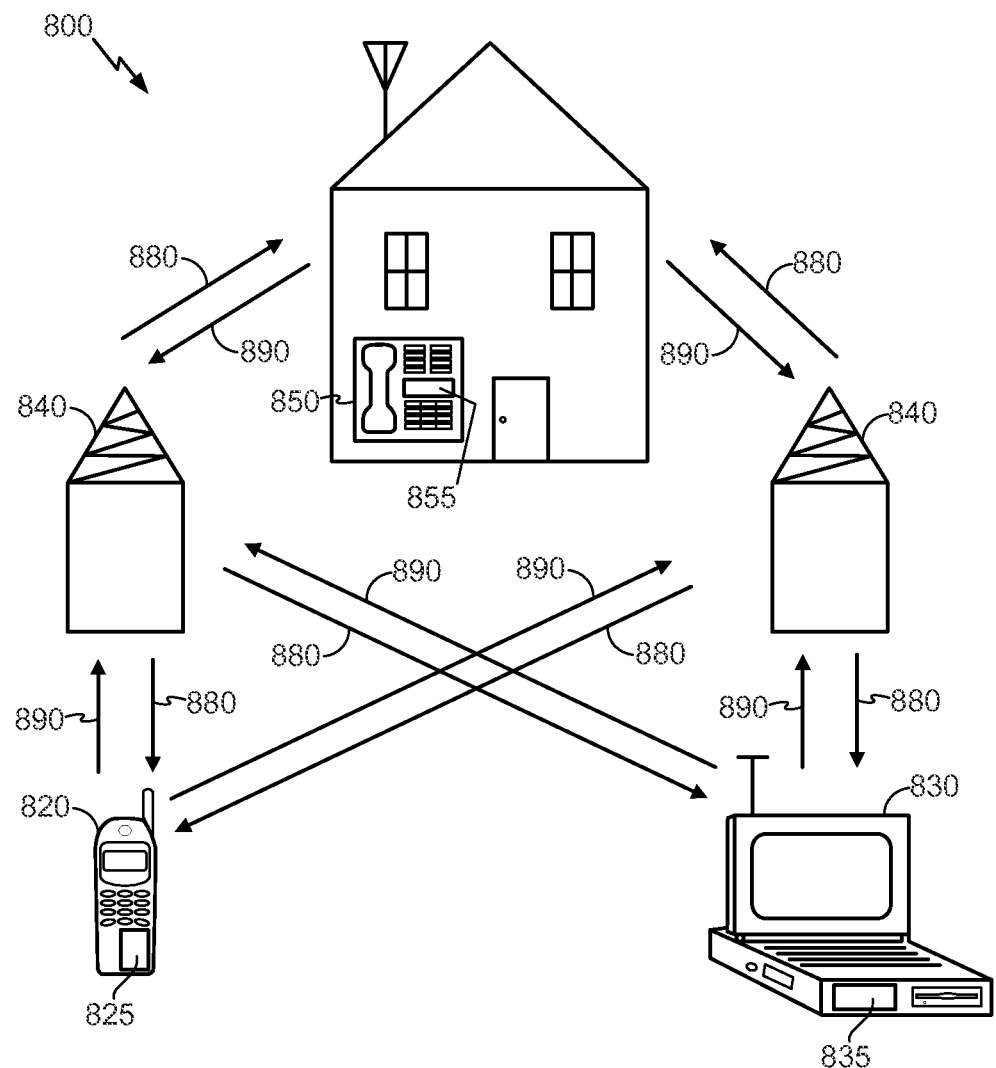
FIG. 8 illustrates an exemplary communication system that includes one or more communication devices with memory architectures that may implement the processor memory optimizations described herein, according to one exemplary embodiment.

According to one embodiment, FIG. 8 illustrates an exemplary communication system 800 that includes one or more communication devices with memory architectures that may implement the processor memory optimizations described herein. For purposes of illustration, FIG. 8 shows three communication devices 820, 830, and 850 and two base stations 840. Those skilled in the pertinent art will recognize that other wireless communication systems in accordance with the exemplary embodiments described herein may have more or fewer communication devices and/or base stations without departing from the scope or spirit of the exemplary embodiments described herein. In one embodiment, the communication devices 820, 830, and 850 may include respective semiconductor devices 825, 835, and 855, wherein the communication devices 820, 830, and 850 and/or the semiconductor devices 825, 835, and 855 respectively associated therewith may include devices in which the processor memory optimizations described herein may be implemented. In one embodiment, as shown in FIG. 8, one or more forward link signals 880 may be used to communicate data from the base stations 840 to the communication devices 820, 830, and 850 and one or more reverse link signals 890 may be used to communicate data from the communication devices 820, 830, and 850 to the base stations 840.

In the exemplary embodiment shown in FIG. 8, communication device 820 may comprise a mobile telephone, communication device 830 may comprise a portable computer, and communication device 850 may comprise a fixed-location remote unit in a wireless local loop system (e.g., meter reading equipment). In various embodiments, however, the communication devices 820, 830, and 850 may include mobile phones, handheld personal communication systems units, portable data units, personal data assistants, navigation devices (e.g., GPS-enabled or location-aware devices), set-top boxes, music players, video players, entertainment units, fixed-location data units, or any other device or combination of devices that can suitably store, retrieve, communicate, or otherwise process data and/or computer-executable instructions. Although FIG. 8 illustrates communication devices 820, 830, and 850 according to the teachings of the disclosure, those skilled in the pertinent art will appreciate that the disclosure shall not be limited to these exemplary illustrated communication devices 820, 830, and 850. Accordingly, various embodiments may be suitably employed or otherwise implemented in any suitable device that has active integrated circuitry including memory and on-chip circuitry for test and characterization.

Those skilled in the pertinent art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any suitable combination thereof.

Further, many embodiments may be described in terms of logical blocks, modules, circuits, algorithms, steps, and sequences of actions, which may be performed or otherwise controlled with a general purpose processor, a DSP, an application specific integrated circuit (ASIC), a field programmable gate array, programmable logic devices, discrete gates, transistor logic, discrete hardware components, elements associated with a computing device, or any suitable combination thereof designed to perform or otherwise control the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Further, those skilled in the pertinent art will appreciate that the various illustrative logical blocks, modules, circuits, algorithms, and steps described in connection with the embodiments disclosed herein may be implemented as electronic hardware, computer software, or any suitable combinations thereof. To clearly illustrate this interchangeability of hardware and software, various illustrative components, blocks, modules, circuits, algorithms, and steps have been described above in terms of their general functionality. Whether such functionality is implemented in hardware or software depends upon the particular application and design constraints, and those skilled in the pertinent art may implement the described functionality in various ways to suit each particular application, but such implementation decisions should not be interpreted as causing a departure from the scope or spirit of the present disclosure. Additionally, the various logical blocks, modules, circuits, algorithms, steps, and sequences of actions described herein can be considered to be embodied entirely within any form of computer readable storage medium having stored therein a corresponding set of computer instructions that upon execution would cause an associated processor to perform the functionality described herein. Thus, the various aspects and embodiments disclosed herein may be embodied in a number of different forms, all of which have been contemplated to be within the scope or spirit of the claimed subject matter. In addition, for each of the embodiments described herein, the corresponding form of any such embodiments may be described herein as, for example, "logic configured to" perform the described action.

The methods, sequences and/or algorithms described in connection with the embodiments disclosed herein may be embodied directly in hardware, in a software module executed by a processor, or any suitable combination thereof. Software modules may reside in memory controllers, DDR memory, RAM, flash memory, ROM, electrically programmable ROM memory (EPROM), electrically erase programmable ROM (EEPROM), registers, hard disks, removable disks, CD-ROMs, or any other storage medium known in the art or storage medium that may be developed in the future. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal or other computing device. In the alternative, the processor and the storage medium may reside as discrete components in a user terminal or other computing device.

In one or more exemplary embodiments, the control functions described may be implemented in hardware, software, firmware, or any combination thereof. If implemented in software, the functions may be stored on or transmitted over as one or more instructions or code on a computer-readable medium. Computer-readable media includes both storage media and communication media, including any medium that facilitates transferring a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage, or other magnetic storage devices or media that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative embodiments of the processor memory optimization via page access counting disclosed herein, those skilled in the pertinent art will appreciate that various changes and modifications could be made herein without departing from the scope or spirit of the disclosure, as defined by the appended claims. The functions, steps, operations, and/or actions of the method claims in accordance with the embodiments disclosed herein need not be performed in any particular order. Furthermore, although elements of the aspects and embodiments disclosed herein may be described or claimed in the singular, the plural is contemplated unless limitation to the singular is explicitly stated.

What is claimed is:

1. A method for efficiently utilizing processor memory, comprising:

monitoring, by a software process executing on a processor, page access counters that measure utilization associated with pages in a main memory located beyond a last-level cache accessible to the processor, wherein the main memory comprises at least a first memory having a first physical memory device type based on a first hardware technology and a second memory having a second physical memory device type based on a second hardware technology, and wherein the first memory has greater efficiency than the second memory; and dynamically changing, by the software process executing on the processor, an assignment associated with at least one of the pages in the main memory between a first physical address space associated with the first memory and a second physical address space associated with the second memory based on the monitored page access counters, wherein dynamically changing the assignment associated with the at least one page comprises:

instructing a first memory controller and a second memory controller to switch the assignment associated with the at least one page between the first physical address space and the second physical address space, wherein the first memory controller is directly coupled between the first memory and an interconnection fabric located beyond the last-level cache and wherein the second memory controller is directly coupled between the second memory and the interconnection fabric; and changing a mapping associated with a virtual address that the processor uses to access the at least one page to reflect the switched assignment between the first physical address space and the second physical address space, wherein a memory management unit coupled between the processor and the interconnection fabric maintains the mapping associated with the virtual address in one or more page tables, and wherein the page access counters that measure the utilization associated with the pages in the main memory are integrated into the one or more page tables maintained at the memory management unit; and wherein the first memory comprises a wide input/output (I/O) memory and the second memory comprises a double data rate (DDR) memory.

2. The method of claim 1, wherein the at least one page comprises a page in the second memory having a high utilization, and wherein dynamically changing the assignment associated with the at least one page further comprises:

instructing the first memory controller and the second memory controller to copy contents associated with at least one page in the second memory that has the high utilization to an available page in the first memory, wherein the at least one page in the second memory that has the high utilization is identified based on the monitored page access counters; and mapping the virtual address that the processor uses to access the at least one page to a physical address that corresponds to the available page in the first memory.

3. The method of claim 2, further comprising:

determining that the page in the second memory has the high utilization based on the page access counter associated therewith exceeding a threshold value, wherein the threshold value is defined to avoid excessive reassignments between the first memory and the second memory.

4. The method of claim 1, wherein the at least one page comprises a page in the first memory having a low utilization, and wherein dynamically changing the assignment associated with the at least one page further comprises:

instructing the first memory controller and the second memory controller to copy contents associated with at least one page in the first memory that has the low utilization to an available page in the second memory, wherein the at least one page in the first memory that has the low utilization is identified based on the monitored page access counters; and mapping the virtual address that the processor uses to access the at least one page to a physical address that corresponds to the available page in the second memory.

5. The method of claim 1, wherein the software process executing on the processor comprises one or more of a kernel routine or an operating system routine.

6. The method of claim 1, wherein the page access counters comprise hardware-based counters integrated into the one or more page tables, and wherein the one or more page tables store mappings between virtual addresses associated with a virtual memory that comprises an entire address range available to the processor and physical addresses associated with the pages in the first memory and the pages in the second memory.

7. The method of claim 6, wherein the hardware-based counters comprise one or more registers that store counts relating to the utilization associated with the pages in the first memory and the pages in the second memory.

8. The method of claim 1, further comprising:

determining that the first memory has greater efficiency than the second memory based on the first memory having one or more of greater capacity, greater throughput, lower latency, or lower power consumption than the second memory.

9. The method of claim 8, wherein the software process executing on the processor comprises one or more of a kernel routine or an operating system routine that determines that the first memory has greater efficiency than the second memory based on one or more predefined criteria that specify the capacity, throughput, latency, and power consumption associated with the first memory and the second memory.

10. The method of claim 8, wherein the software process executing on the processor comprises one or more of a kernel routine or an operating system routine that determines that the first memory has greater efficiency than the second memory based on a benchmarking process that measures the capacity, throughput, latency, and power consumption associated with the first memory and the second memory.

11. The method of claim 1, further comprising:

detecting an event associated with the at least one page; and updating one of the page access counters that measures the utilization associated with the at least one page based on a type associated with the detected event.

12. The method of claim 11, wherein updating the page access counter comprises incrementing the page access counter associated with the at least one page in response to determining that the type associated with the detected event comprises accessing the at least one page.

13. The method of claim 11, wherein updating the page access counter comprises resetting the page access counter associated with the at least one page in response to determining that the type associated with the detected event comprises evicting an entry that corresponds to the at least one page from a data structure that maps the virtual address associated with the at least one page to a corresponding physical address associated with the at least one page.

14. The method of claim 1, wherein the first hardware technology enables chip-level three-dimensional stacking with through silicon via (TSV) interconnects and memory chips stacked upon a system on a chip (SoC) and the second hardware technology uses one or more phase-locked loops (PLLs) to control timing associated with electrical data and clock signals to realize high transfer rates.

15. The method of claim 1, further comprising:

instructing the first memory controller and the second memory controller to reassign pages in the second memory that have highest utilizations to the first memory until the first memory fills up;

determining that a page in the second memory has reached a higher utilization level than one of the pages reassigned to the first memory; and instructing the first memory controller and the second memory controller to switch the page in the second memory that has reached the higher utilization level with the one of the reassigned pages in the first memory.

16. The method of claim 1, further comprising:

triggering the software process to dynamically change the assignment associated with the at least one page in response to determining that one or more of the first memory or the second memory has a threshold number of unallocated pages available.

17. The method of claim 1, further comprising:

triggering the software process to dynamically change the assignment associated with the at least one page in response to determining that a threshold number of pages have been allocated in one or more of the first memory or the second memory.

18. The method of claim 1, further comprising:

triggering the software process to dynamically change the assignment associated with the at least one page subsequent to one or more of each input/output operation or a predetermined number of input/output operations.

19. An apparatus, comprising;

means for monitoring page access counters that measure utilization associated with pages in a main memory located beyond a last-level cache accessible to a processor, wherein the main memory comprises at least a first memory having a first physical memory device type based on a first hardware technology and a second memory having a second physical memory device type based on a second hardware technology, and wherein the first memory has greater efficiency than the second memory; and means for dynamically changing an assignment associated with at least one of the pages in the main memory between a first physical address space associated with the first memory and a second physical address space associated with the second memory based on the monitored page access counters, wherein the means for dynamically changing the assignment associated with the at least one page comprises:
  means for instructing a first memory controller and a second memory controller to switch the assignment associated with the at least one page between the first physical address space and the second physical address space, wherein the first memory controller is directly coupled between the first memory and an interconnection fabric located beyond the last-level cache and wherein the second memory controller is directly coupled between the second memory and the interconnection fabric; and
  means for changing a mapping associated with a virtual address that the processor uses to access the at least one page to reflect the switched assignment between the first physical address space and the second physical address space, wherein a memory management unit coupled between the processor and the interconnection fabric maintains the mapping associated with the virtual address in one or more page tables, and wherein the page access counters that measure the utilization associated with the pages in the main memory are integrated into the one or more page tables; and
  wherein the first memory comprises a wide input/output (I/O) memory and the second memory comprises a double data rate (DDR) memory.

20. The apparatus of claim 19, wherein the at least one page comprises a page in the second memory having a high utilization, and wherein the means for dynamically changing the assignment associated with the at least one page further comprises:
  means for instructing the first memory controller and the second memory controller to copy contents associated with at least one page in the second memory that has the high utilization to an available page in the first memory, wherein the at least one page in the second memory that has the high utilization is identified based on the monitored page access counters; and
  means for mapping the virtual address that the processor uses to access the at least one page to a physical address that corresponds to the available page in the first memory.

21. The apparatus of claim 19, wherein the at least one page comprises a page in the first memory having a low utilization, and wherein the means for dynamically changing the assignment associated with the at least one page further comprises:
  means for instructing the first memory controller and the second memory controller to copy contents associated with at least one page in the first memory that has the low utilization to an available page in the second memory, wherein the at least one page in the first memory that has the low utilization is identified based on the monitored page access counters; and
  means for mapping the virtual address that the processor uses to access the at least one page to a physical address that corresponds to the available page in the second memory.

22. The apparatus of claim 19, wherein the means for dynamically assigning the pages in the first memory and the pages in the second memory comprises one or more of a kernel routine or an operating system routine executing on the processor.

23. The apparatus of claim 19, wherein the page access counters comprise hardware-based counters integrated into the one or more page tables, and wherein the one or more page tables store mappings between virtual addresses associated with a virtual memory that comprises an entire address range available to the processor and physical addresses associated with the pages in the first memory and the pages in the second memory.

24. The apparatus of claim 23, wherein the hardware-based counters comprise one or more registers that store counts relating to the utilization associated with the pages in the first memory and the pages in the second memory.

25. The apparatus of claim 19, further comprising:
  means for determining that the first memory has greater efficiency than the second memory based on the first memory having one or more of greater capacity, greater throughput, lower latency, or lower power consumption than the second memory.

26. The apparatus of claim 25, wherein the means for determining that the first memory has greater efficiency than the second memory is configured to determine that the first memory has greater efficiency than the second memory based on one or more predefined criteria that specify the capacity, throughput, latency, and power consumption associated with the first memory and the second memory.

27. The apparatus of claim 25, wherein the means for determining that the first memory has greater efficiency than the second memory is configured to determine that the first memory has greater efficiency than the second memory based on a benchmarking process that measures the capacity, throughput, latency, and power consumption associated with the first memory and the second memory.

28. The apparatus of claim 19, further comprising:
  means for detecting an event associated with the at least one page; and
  means for updating one of the page access counters that measures the utilization associated with the at least one page based on a type associated with the detected event.

29. The apparatus of claim 28, wherein the means for updating the page access counter comprises means for incrementing the page access counter associated with the at least one page in response to determining that the type associated with the detected event comprises accessing the at least one page.

30. The apparatus of claim 28, wherein the means for updating the page access counter comprises means for resetting the page access counter associated with the at least one page in response to determining that the type associated with the detected event comprises evicting an entry that corresponds to the at least one page from a data structure that maps the virtual address associated with the at least one page to a corresponding physical address associated with the at least one page.

31. The apparatus of claim 19, wherein the first hardware technology enables chip-level three-dimensional stacking with through silicon via (TSV) interconnects and memory chips stacked upon a system on a chip (SoC) and the second hardware technology uses one or more phase-locked loops (PLLs) to control timing associated with electrical data and clock signals to realize high transfer rates.

32. A non-transitory computer-readable storage medium having computer-executable instructions recorded thereon, wherein executing the computer-executable instructions on a processor causes the processor to:
  monitor page access counters that measure utilization associated with pages in a main memory located beyond a last-level cache accessible to the processor, wherein the main memory comprises at least a first memory having a first physical memory device type based on a first hardware technology and a second memory having a second physical memory device type based on a second hardware technology, and wherein the first memory has greater efficiency than the second memory; and dynamically change an assignment associated with at least one of the pages in the main memory between a first physical address space associated with the first memory and a second physical address space associated with the second memory based on the monitored page access counters, wherein the computer-executable instructions further cause the processor to:

instruct a first memory controller and a second memory controller to switch the assignment associated with the at least one page between the first physical address space and the second physical address space, wherein the first memory controller is directly coupled between the first memory and an interconnection fabric located beyond the last-level cache and wherein the second memory controller is directly coupled between the second memory and the interconnection fabric; and change a mapping associated with a virtual address that the processor uses to access the at least one page to reflect the switched assignment between the first physical address space and the second physical address space, wherein a memory management unit coupled between the processor and the interconnection fabric maintains the mapping associated with the virtual address in one or more page tables, and wherein the page access counters that measure the utilization associated with the pages in the main memory are integrated into the one or more page tables maintained at the memory management unit; and wherein the first memory comprises a wide input/output (I/O) memory and the second memory comprises a double data rate (DDR) memory.

33. The non-transitory computer-readable storage medium of claim 32, wherein the at least one page comprises a page in the second memory having a high utilization, and wherein the computer-executable instructions further cause the processor to:

instruct the first memory controller and the second memory controller to copy contents associated with at least one page in the second memory that has the high utilization to an available page in the first memory, wherein the at least one page in the second memory that has the high utilization is identified based on the monitored page access counters; and map the virtual address that the processor uses to access the at least one page to a physical address that corresponds to the available page in the first memory.

34. The non-transitory computer-readable storage medium of claim 32, wherein the at least one page comprises a page in the first memory having a low utilization, and wherein the computer-executable instructions further cause the processor to:

instruct the first memory controller and the second memory controller to copy contents associated with at least one page in the first memory that has the low utilization to an available page in the second memory, wherein the at least one page in the first memory that has the low utilization is identified based on the monitored page access counters; and map the virtual address that the processor uses to access the at least one page to a physical address that corresponds to the available page in the second memory.

35. The non-transitory computer-readable storage medium of claim 32, wherein the computer-executable instructions comprise one or more of a kernel routine or an operating system routine.

36. The non-transitory computer-readable storage medium of claim 32, wherein the page access counters comprise hardware-based counters integrated into the one or more page tables, and wherein the one or more page tables store mappings between virtual addresses associated with a virtual memory that comprises an entire address range available to the processor and physical addresses associated with the pages in the first memory and the pages in the second memory.

37. The non-transitory computer-readable storage medium of claim 36, wherein the hardware-based counters comprise one or more registers that store counts relating to the utilization associated with the pages in the first memory and the pages in the second memory.

38. The non-transitory computer-readable storage medium of claim 32, wherein the computer-executable instructions that cause the processor to dynamically assign the pages in the first memory and the pages in the second memory further cause the processor to:

determine that the first memory has greater efficiency than the second memory based on the first memory having one or more of greater capacity, greater throughput, lower latency, or lower power consumption than the second memory.

39. The non-transitory computer-readable storage medium of claim 38, wherein the computer-executable instructions cause the processor to determine that the first memory has greater efficiency than the second memory based on one or more predefined criteria that specify the capacity, throughput, latency, and power consumption associated with the first memory and the second memory.

40. The non-transitory computer-readable storage medium of claim 38, wherein the computer-executable instructions cause the processor to determine that the first memory has greater efficiency than the second memory based on a benchmarking process that measures the capacity, throughput, latency, and power consumption associated with the first memory and the second memory.

41. The non-transitory computer-readable storage medium of claim 32, wherein executing the computer-executable instructions on the processor further causes the processor to:

detect an event associated with the at least one page; and update one of the page access counters that measures the utilization associated with the at least one page based on a type associated with the detected event.

42. The non-transitory computer-readable storage medium of claim 41, wherein the computer-executable instructions that cause the processor to update the page access counter further cause the processor to increment the page access counter associated with the at least one page in response to determining that the type associated with the detected event comprises accessing the at least one page.

43. The non-transitory computer-readable storage medium of claim 41, wherein the computer-executable instructions that cause the processor to update the page access counter further cause the processor to reset the page access counter associated with the page at least one page in response to determining that the type associated with the detected event comprises evicting an entry that corresponds to the at least one page from a data structure that maps the virtual address associated with the at least one page to a corresponding physical address associated with the at least one page.

44. The non-transitory computer-readable storage medium of claim 32, wherein the first hardware technology enables chip-level three-dimensional stacking with through silicon via (TSV) interconnects and memory chips stacked upon a system on a chip (SoC) and the second hardware technology uses one or more phase-locked loops (PLLs) to control timing associated with electrical data and clock signals to realize high transfer rates.

45. An apparatus, comprising:
a processor;
an interconnection fabric;
a main memory architecture located beyond a last-level cache accessible to the processor, wherein the main memory architecture comprises:
a first memory having a first physical memory device type based on a first hardware technology;
a first memory controller directly coupled between the first memory and the interconnection fabric, the interconnection fabric located beyond the last-level cache;
a second memory having a second physical memory device type based on a second hardware technology, wherein the first memory has greater efficiency than the second memory and the first memory comprises a wide input/output (I/O) memory and the second memory comprises a double data rate (DDR) memory; and
a second memory controller directly coupled between the second memory and the interconnection fabric;
a memory management unit coupled between the processor and the interconnection fabric and configured to maintain one or more page tables having page access counters integrated therein, the page access counters configured to measure utilization associated with pages in the main memory; and
a computer-readable storage medium configured to store one or more of a kernel routine or an operating system routine executable on the processor to cause the processor to:
monitor the page access counters that measure the utilization associated with the pages in the main memory; and
dynamically change an assignment associated with at least one of the pages in the main memory between a first physical address space associated with the first memory and a second physical address associated with the second memory based on the monitored page access counters, the kernel or operating system routine further executable on the processor to cause the processor to:
instruct the first memory controller and the second memory controller to switch the assignment associated with the at least one page between the First physical address space and the second physical address space; and
change a mapping associated with a virtual address used at the processor to access the at least one page to reflect the switched assignment between the first physical address space and the second physical address space, the memory management unit configured to maintain the mapping associated with the virtual address in the one or more page tables having the page access counters integrated therein.

46. The apparatus of claim 45, wherein the at least one page comprises a page in the second memory having a high utilization, and wherein the kernel or operating system routine is further executable on the processor to cause the processor to:
instruct the first memory controller and the second memory controller to copy contents associated with at least one page in the second memory that has the high utilization to an available page in the first memory, wherein the at least one page in the second memory that has the high utilization is identified based on the monitored page access counters; and
map the virtual address that the processor uses to access the at least one page to a physical address that corresponds to the available page in the first memory.

47. The apparatus of claim 45, wherein the at least one page comprises a page in the first memory having a low utilization, and wherein the kernel or operating system routine is further executable on the processor to cause the processor to:
instruct the first memory controller and the second memory controller to copy contents associated with at least one page in the first memory that has the low utilization to an available page in the second memory, wherein the at least one page in the first memory that has the low utilization is identified based on the monitored page access counters; and
map the virtual address that the processor uses to access the at least one page to a physical address that corresponds to the available page in the second memory.

48. The apparatus of claim 45, wherein the page access counters comprise hardware-based counters integrated into the one or more page tables.

49. The apparatus of claim 48, wherein the hardware-based counters comprise one or more registers configured to store counts relating to the utilization associated with the pages in the first memory and the pages in the second memory.

50. The apparatus of claim 45, wherein the kernel or operating system routine further causes the processor to:
determine that the first memory has greater efficiency than the second memory based on the first memory having one or more of greater capacity, greater throughput, lower latency, or lower power consumption than the second memory.

51. The apparatus of claim 50, wherein the kernel or operating system routine causes the processor to determine that the first memory has greater efficiency than the second memory based on one or more predefined criteria that specify the capacity, throughput, latency, and power consumption associated with the first memory and the second memory.

52. The apparatus of claim 50, wherein the kernel or operating system routine causes the processor to determine that the first memory has greater efficiency than the second memory based on a benchmarking process that measures the capacity, throughput, latency, and power consumption associated with the first memory and the second memory.

53. The apparatus of claim 45, wherein the kernel or operating system routine further causes the processor to:
detect an event associated with the at least one page; and
increment the page access counter associated with the at least one page in response to determining that the type associated with the detected event comprises accessing the at least one page.

54. The apparatus of claim 45, wherein the kernel or operating system routine further causes the processor to:
detect an event associated with the at least one page; and
reset the page access counter associated with the at least one page in response to determining that the type associated with the detected event comprises evicting an entry that corresponds to the at least one page from a data structure that maps the virtual address associated with the at least one page to a corresponding physical address associated with the at least one page.

55. The apparatus of claim 45, wherein the processor comprises a mobile processor and wherein the first hardware technology enables chip-level three-dimensional stacking with through silicon via (TSV) interconnects and memory chips stacked upon a system on a chip (SoC) and the second hardware technology uses one or more phase-locked loops (PLLs) to control timing associated with electrical data and clock signals to realize high transfer rates.

* * * * *